United States Patent
Lee (10) Patent No.: US 8,698,524 B2
(45) Date of Patent: Apr. 15, 2014

(54) INTERNAL VOLTAGE GENERATION CIRCUITS

(75) Inventor: Myung Hwan Lee, Cheonan-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/591,060

(22) Filed: Aug. 21, 2012

(65) Prior Publication Data

US 2013/0307592 A1    Nov. 21, 2013

(30) Foreign Application Priority Data

May 21, 2012    (KR) .................. 10-2012-0053902

(51) Int. Cl.
*H03B 1/00*    (2006.01)
*H03K 3/00*    (2006.01)

(52) U.S. Cl.
USPC ........... 327/109; 327/108; 327/110; 327/111; 327/112

(58) Field of Classification Search
USPC ......................... 327/108, 540, 543
See application file for complete search history.

(56) References Cited

U.S. PATENT DOCUMENTS

2012/0218006 A1*    8/2012    Lee .............................. 327/108

FOREIGN PATENT DOCUMENTS

| KR | 100390994 B1 | 6/2003 |
|----|--------------|--------|
| KR | 1020070074991 A | 7/2007 |

\* cited by examiner

*Primary Examiner* — John Poos
(74) *Attorney, Agent, or Firm* — William Park & Associates Patent Ltd.

(57) ABSTRACT

Internal voltage generation circuits are provided. The internal voltage generation circuit includes a driving signal generator comparing first and second internal voltage signals with lower and upper limit reference voltage signals to generate a pull-up driving signal and a pull-down driving signal, a driver generating a first voltage and a second voltage in response to the pull-up driving signal and the pull-down driving signal, a selecting signal generator comparing the first internal voltage signal with the second internal voltage signal to generate a selection signal, and a selection transmitter that transmits any one of the first and second voltages to the first or second internal voltage signal in response to the selection signal.

28 Claims, 5 Drawing Sheets

INTERNAL VOLTAGE GENERATION CIRCUITS

CROSS-REFERENCES TO RELATED APPLICATIONS

The present application claims priority under 35 U.S.C 119(a) to Korean Application No. 10-2012-0053902, filed on May 21, 2012, in the Korean Intellectual Property Office, which is incorporated herein by reference in its entirety.

BACKGROUND

Embodiments of the present disclosure relate generally to semiconductor integrated circuits, and more particularly to internal voltage generation circuits.

In general, a semiconductor memory device receives a power supply voltage VDD and a ground voltage VSS from an external device to generate internal voltages used in various operations of internal circuits constituting the semiconductor memory device. The internal voltages for operating the internal circuits of the semiconductor memory device may include a core voltage VCORE supplied to a memory core region, a high voltage VPP used to drive or overdrive word lines or the like, and a back-bias voltage VBB applied to a bulk region (or a substrate) of NMOS transistors in the memory core region.

The core voltage VCORE may be a positive voltage which is lower than the power supply voltage VDD supplied by the external device. Thus, the core voltage VCORE may be generated by lowering the power supply voltage VDD to a certain level. In contrast, the high voltage VPP may be higher than the power supply voltage VDD, and the back-bias voltage VBB may be a negative voltage which is lower than the ground voltage VSS. Thus, charge pump circuits may be required to generate the high voltage VPP and the back-bias voltage VBB.

In addition, the internal voltages used in the semiconductor memory device may include a bit line pre-charge voltage VBLP for pre-charging bit lines and a cell plate voltage VCP applied to a plate electrode of memory cells. The bit line pre-charge voltage VBLP and the cell plate voltage VCP may be set to have the same level (e.g., a half of the core voltage VCORE). Accordingly, the bit line pre-charge voltage VBLP and the cell plate voltage VCP may be generated by internal voltage generation circuits having the same configuration. The internal voltage generation circuits for generating the bit line pre-charge voltage VBLP and the cell plate voltage VCP may be configured such that different internal voltage generation circuits generate the bit line pre-charge voltage VBLP and the cell plate voltage VCP, respectively.

SUMMARY

Example embodiments are directed to internal voltage generation circuits.

According to some embodiments, an internal voltage generation circuit includes a driving signal generator comparing first and second internal voltage signals with lower and upper limit reference voltage signals to generate a pull-up driving signal and a pull-down driving signal, a driver generating a first voltage and a second voltage in response to the pull-up driving signal and the pull-down driving signal, a selecting signal generator comparing the first internal voltage signal with the second internal voltage signal to generate a selection signal, and a selection transmitter that transmits any one of the first and second voltages to the first or second internal voltage signal in response to the selection signal.

According to further embodiments, an internal voltage generation circuit includes a pull-up driver comparing first and second internal voltage signals with a lower limit reference voltage signal to pull up a first voltage, a pull-down driver comparing the first and second internal voltage signals with an upper limit reference voltage signal to pull down a second voltage, a selecting signal generator comparing the first internal voltage signal with the second internal voltage signal to generate a selection signal, a first selector transmitting the first voltage as the first internal voltage signal or the second internal voltage signal in response to the selection signal, and a second selector transmitting the second voltage as the first internal voltage signal or the second internal voltage signal in response to the selection signal.

According to further embodiments, an internal voltage generation circuit includes a comparison signal generator comparing first and second internal voltage signals with a reference voltage signal to generate a first comparison signal and a second comparison signal, a voltage generator generating a first voltage and a second voltage in response to the first and second comparison signals, a selecting signal generator comparing the first internal voltage signal with the second internal voltage signal to generate a selection signal, and a selection transmitter that transmits any one of the first and second voltages to the first or second internal voltage signal in response to the selection signal.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Example embodiments of the present invention will be described hereinafter with reference to the accompanying drawings. However, the embodiments described herein are for illustrative purposes only and are not intended to limit the scope of the invention.

Figure 1:
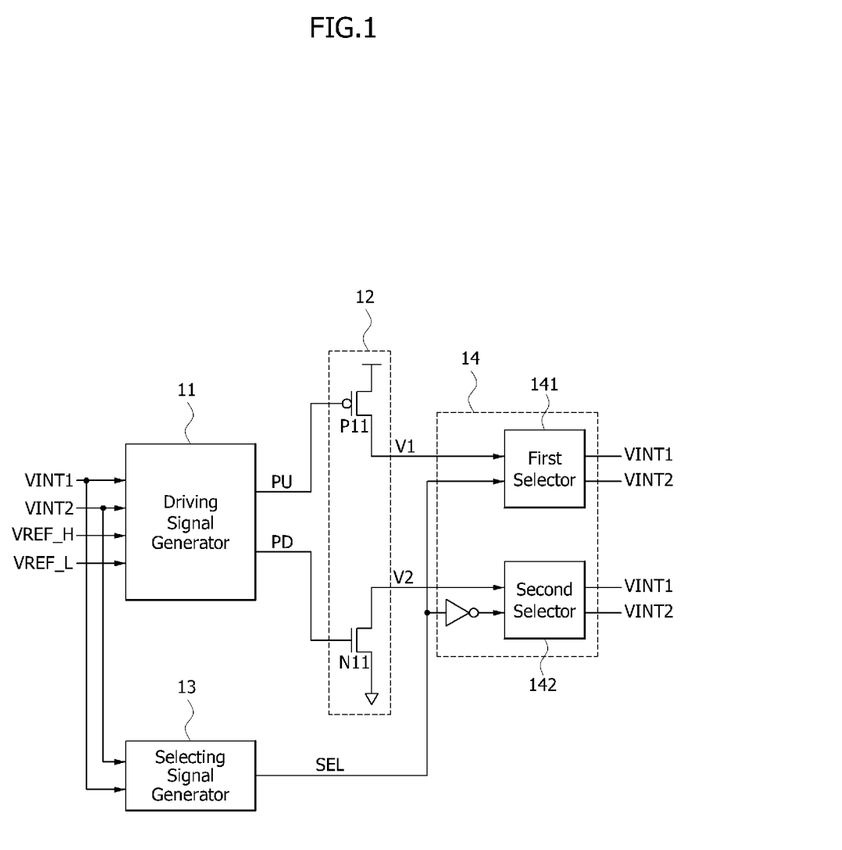
FIG. 1 is a block diagram illustrating a configuration of an internal voltage generation circuit according to an embodiment of the present invention.

FIG. 1 is a block diagram illustrating a configuration of an internal voltage generation circuit according to an example embodiment of the present invention.

As illustrated in FIG. 1, an internal voltage generation circuit according to an example embodiment of the present invention may be configured to include a driving signal generator 11, a driver 12, a selecting signal generator 13 and a selection transmitter 14.

The driving signal generator 11 may generate a pull-up driving signal PU and a pull-down driving signal PD in response to a first internal voltage signal VINT1, a second internal voltage signal VINT2, a lower limit reference voltage signal VREF_L and an upper limit reference voltage signal VREF_H. For example, the driving signal generator 11 may operate such that the pull-up driving signal PU is enabled, e.g., the pull-up driving signal PU has a logic "low" state when at least one of the first and second internal voltage signals VINT1 and VINT2 has a lower voltage level than the lower limit reference voltage signal VREF_L, and the driving signal generator 11 may operate such that the pull-down driving signal PD is enabled, e.g., the pull-down driving signal PD has a logic "high" state when at least one of the first and second internal voltage signals VINT1 and VINT2 has a higher voltage level than the upper limit reference voltage signal VREF_H. A detailed configuration of the driving signal generator 11 will be described with reference to FIG. 2.

The driver 12 may include a PMOS transistor P11 acting as a pull-up driving element and an NMOS transistor N11 acting as a pull-down driving element. An output voltage of the driver 12 (e.g., a first voltage V1 which is outputted from the drain of the PMOS transistor P11) may be pulled up to have a power supply voltage when the pull-up driving signal PU is enabled, e.g. when the pull-up driving signal PU has a logic "low" state, and an output voltage of the driver 12 (e.g., a second voltage V2 which is outputted from the drain of the NMOS transistor N12) may be pulled down to have a ground voltage when the pull-down driving signal PD is enabled, e.g. when the pull-down driving signal PD has a logic "high" state.

The selecting signal generator 13 may compare the first internal voltage signal VINT1 with the second internal voltage signal VINT2 to generate a selection signal SEL. The selection signal SEL may have a logic "low" state when the first internal voltage signal VINT1 has a lower voltage level than the second internal voltage signal VINT2, and the selection signal SEL may have a logic "high" state when the first internal voltage signal VINT1 has a higher voltage level than the second internal voltage signal VINT2. Alternatively, the selection signal SEL may have a logic "high" state when the first internal voltage signal VINT1 has a lower voltage level than the second internal voltage signal VINT2, and the selection signal SEL may have a logic "low" state when the first internal voltage signal VINT1 has a higher voltage level than the second internal voltage signal VINT2.

The selection transmitter 14 may be configured to output the first and second internal voltage signals VINT1 and VINT2 in response to the first and second voltages V1 and V2. The selection transmitter 14 may include a first selector 141 and a second selector 142. For example, the first selector 141 may transmit the first voltage V1 as the first internal voltage signal VINT1 when the selection signal SEL has a logic "low" state and may transmit the first voltage V1 as the second internal voltage signal VINT2 when the selection signal SEL has a logic "high" state. For example, the second selector 142 may transmit the second voltage V2 as the second internal voltage signal VINT2 when the selection signal SEL has a logic "low" state and may transmit the second voltage V2 as the first internal voltage signal VINT1 when the selection signal SEL has a logic "high" state.

In an embodiment of the present invention, the first and second internal voltage signals VINT1 and VINT2 may be voltage signals for driving internal circuits of integrated circuits including semiconductor memory devices. For example, the first and second internal voltage signals VINT1 and VINT2 may correspond to a bit line pre-charge voltage signal VBLP for pre-charging bit lines and a cell plate voltage signal VCP applied to a plate electrode of memory cells, respectively.

Figure 2:
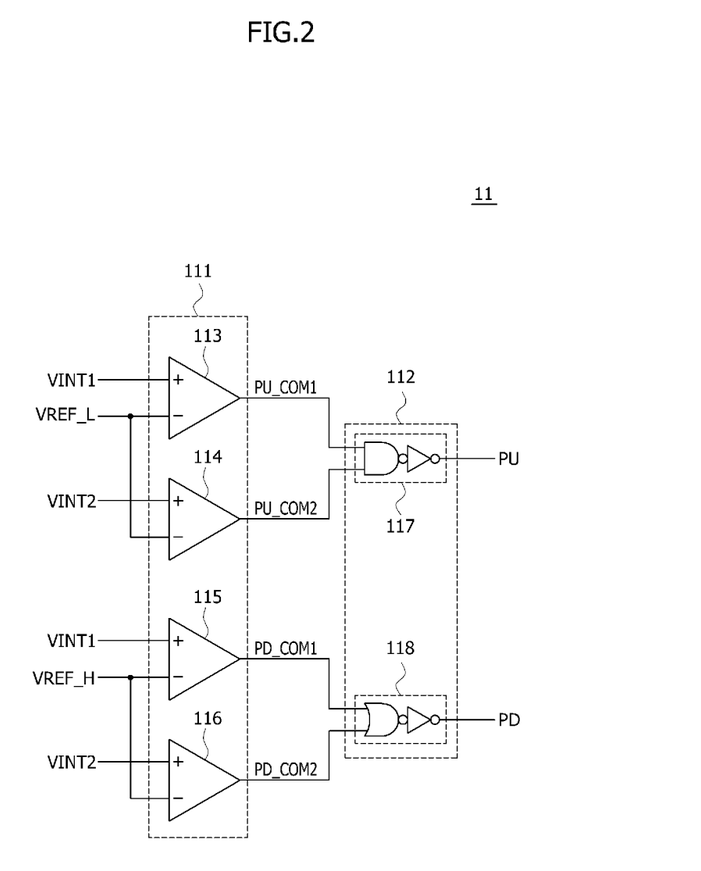
FIG. 2 is a circuit diagram illustrating an example of a driving signal generator included in an internal voltage generation circuit shown in FIG. 1.

FIG. 2 is a circuit diagram illustrating an example of a driving signal generator included in an internal voltage generation circuit shown in FIG. 1.

As illustrated in FIG. 2, the driving signal generator 11 may be configured to include a comparison signal generator 111 and a signal combining unit 112.

The comparison signal generator 111 may include a first comparator 113, a second comparator 114, a third comparator 115 and a fourth comparator 116. The first comparator 113 may generate an enabled first pull-up comparison signal PU_COM1, e.g. a first pull-up comparison signal PU_COM1 having a logic "low" state when the first internal voltage signal VINT1 has a lower voltage level than the lower limit reference voltage signal VREF_L, and the second comparator 114 may generate an enabled second pull-up comparison signal PU_COM2, e.g., a second pull-up comparison signal PU_COM2 having a logic "low" state when the second internal voltage signal VINT2 has a lower voltage level than the lower limit reference voltage signal VREF_L. The third comparator 115 may generate an enabled first pull-down comparison signal PD_COM1, e.g., a first pull-down comparison signal PD_COM1 having a logic "high" state when the first internal voltage signal VINT1 has a higher voltage level than the upper limit reference voltage signal VREF_H, and the fourth comparator 116 may generate an enabled second pull-down comparison signal PD_COM2, e.g., a second pull-down comparison signal PD_COM2 having a logic "high" state when the second internal voltage signal VINT2 has a higher voltage level than the upper limit reference voltage signal VREF_H.

The signal combining unit 112 may include a first signal combining unit 117 and a second signal combining unit 118. The first signal combining unit 117 may generate the pull-up driving signal PU enabled to have a logic "low" state when at least one of the first and second pull-up comparison signals PU_COM1 and PU_COM2 is enabled to have a logic "low" state, and the second signal combining unit 118 may generate the pull-down driving signal PD enabled to have a logic "high" state when at least one of the first and second pull-down comparison signals PD_COM1 and PU_COM2 is enabled to have a logic "high" state.

As described above, according to an embodiment of the present invention, the driver 12 may be commonly used in generation of the first internal voltage signal VINT1 having a first internal voltage as well as the second internal voltage signal VINT2 having a second internal voltage.

Referring again to FIGS. 1 and 2, when at least one of the first and second internal voltage signals VINT1 and VINT2 has a lower voltage level than the lower limit reference voltage signal VREF_L, the pull-up driving signal PU having a logic "low" state may turn on the PMOS transistor P11 to pull up the first voltage V1 to a power supply voltage and the first voltage V1 may be transmitted as either the first internal voltage signal VINT1 or the second internal voltage signal VINT2. For example, when the first internal voltage signal VINT1 has a lower voltage level than the lower limit reference voltage signal VREF_L and the second internal voltage signal VINT2 has a higher voltage level than the lower limit reference voltage signal VREF_L, the first voltage V1 may be transmitted as the first internal voltage signal VINT1. Further, when the first and second internal voltage signals VINT1 and VINT2 have lower voltage levels than the lower limit reference voltage signal VREF_L and the second internal voltage signal VINT2 has a lower voltage level than the first internal voltage signal VINT1, the first voltage V1 may be transmitted as the second internal voltage signal VINT2 and may then be transmitted as the first internal voltage signal VINT1.

Alternatively, when at least one of the first and second internal voltage signals VINT1 and VINT2 has a higher voltage level than the upper limit reference voltage signal VREF_H, the pull-down driving signal PD having a logic "high" state may turn on the NMOS transistor N11 to pull down the second voltage V2 to a ground voltage and the second voltage V2 may be transmitted as either the first internal voltage signal VINT1 or the second internal voltage signal VINT2. For example, when the first internal voltage signal VINT1 has a higher voltage level than the upper limit reference voltage signal VREF_H and the second internal voltage signal VINT2 has a lower voltage level than the upper limit reference voltage signal VREF_H, the second voltage V2 may be transmitted as the first internal voltage signal VINT1. Further, when the first and second internal voltage signals VINT1 and VINT2 have higher voltage levels than the upper limit reference voltage signal VREF_H and the second internal voltage signal VINT2 has a higher voltage level than the first internal voltage signal VINT1, the second voltage V2 may be transmitted as the second internal voltage signal VINT2 and may then be transmitted as the first internal voltage signal VINT1.

According to an embodiment of the present invention, the driver 12 may be commonly used in generation of the first internal voltage signal VINT1 having a first internal voltage as well as the second internal voltage signal VINT2 having a second internal voltage. Thus, an area that the internal voltage generation circuit occupies may be reduced.

Figure 3:
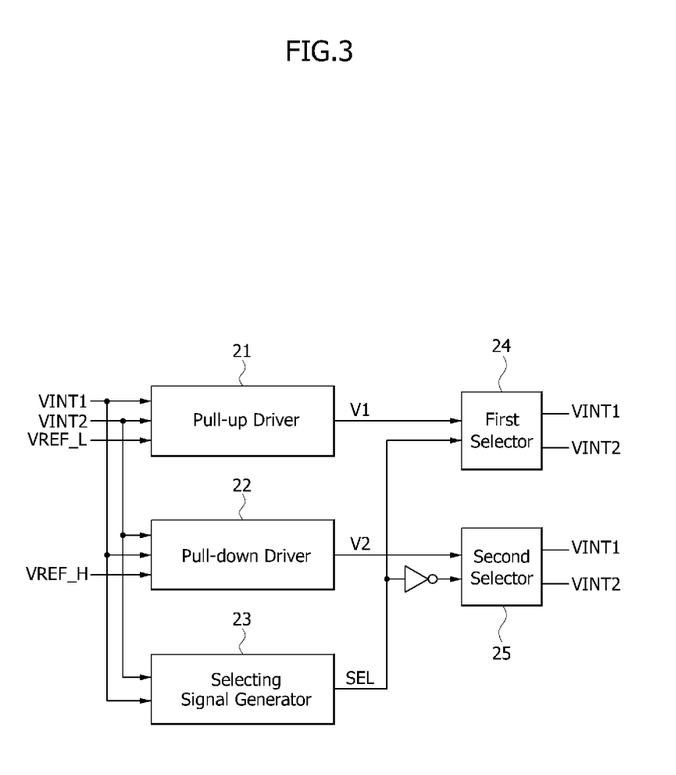
FIG. 3 is a block diagram illustrating a configuration of an internal voltage generation circuit according to an embodiment of the present invention.

FIG. 3 is a block diagram illustrating a configuration of an internal voltage generation circuit according to an example embodiment of the present invention.

As illustrated in FIG. 3, an internal voltage generation circuit according to an embodiment of the present invention may be configured to include a pull-up driver 21, a pull-down driver 22, a selecting signal generator 23, a first selector 24 and a second selector 25.

The pull-up driver 21 may pull up a first voltage V1 to a power supply voltage when at least one of first and second internal voltage signals VINT1 and VINT2 has a lower voltage level than a lower limit reference voltage signal VREF_L. A detailed configuration of the pull-up driver 21 will be described with reference to FIG. 4.

The pull-down driver 22 may pull down a second voltage V2 to a ground voltage when at least one of first and second internal voltage signals VINT1 and VINT2 has a higher voltage level than an upper limit reference voltage signal VREF_H. A detailed configuration of the pull-down driver 22 will be described with reference to FIG. 5.

The selecting signal generator 23 may compare the first internal voltage signal VINT1 with the second internal voltage signal VINT2 to generate a selection signal SEL. The selection signal SEL may have a logic "low" state when the first internal voltage signal VINT1 has a lower voltage level than the second internal voltage signal VINT2, and the selection signal SEL may have a logic "high" state when the first internal voltage signal VINT1 has a higher voltage level than the second internal voltage signal VINT2. Alternatively, the selection signal SEL may have a logic "high" state when the first internal voltage signal VINT1 has a lower voltage level than the second internal voltage signal VINT2, and the selection signal SEL may have a logic "low" state when the first internal voltage signal VINT1 has a higher voltage level than the second internal voltage signal VINT2.

The first selector 24 may transmit the first voltage V1 as the first internal voltage signal VINT1 when the selection signal SEL has a logic "low" state and may transmit the first voltage V1 as the second internal voltage signal VINT2 when the selection signal SEL has a logic "high" state.

The second selector 25 may transmit the second voltage V2 as the second internal voltage signal VINT2 when the selection signal SEL has a logic "low" state and may transmit the second voltage V2 as the first internal voltage signal VINT1 when the selection signal SEL has a logic "high" state.

Figure 4:
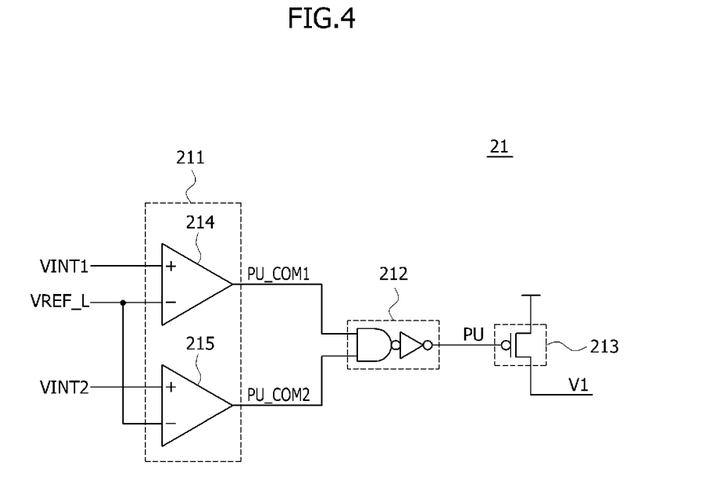
FIG. 4 is a circuit diagram illustrating an example of a pull-up driver included in an internal voltage generation circuit shown in FIG. 3.

FIG. 4 is a circuit diagram illustrating an example of a pull-up driver included in an internal voltage generation circuit shown in FIG. 3.

As illustrated in FIG. 4, the pull-up driver 21 may be configured to include a first comparison signal generator 211, a first signal combining unit 212 and a pull-up unit 213. The first comparison signal generator 211 may include a first comparator 214 and a second comparator 215. The first comparator 214 may generate an enabled first pull-up comparison signal PU_COM1, e.g., a first pull-up comparison signal PU_COM1 having a logic "low" state when the first internal voltage signal VINT1 has a lower voltage level than the lower limit reference voltage signal VREF_L, and the second comparator 215 may generate an enabled second pull-up comparison signal PU_COM2, e.g., a second pull-up comparison signal PU_COM2 having a logic "low" state when the second internal voltage signal VINT2 has a lower voltage level than the lower limit reference voltage signal VREF_L. The first signal combining unit 212 may generate an enabled pull-up driving signal PU, e.g., a pull-up driving signal PU having a logic "low" state when at least one of the first and second pull-up comparison signals PU_COM1 and PU_COM2 is enabled to have a logic "low" state. The pull-up unit 213 may pull up the first voltage V1 to a power supply voltage when the pull-up driving signal PU is enabled to have a logic "low" state.

Figure 5:
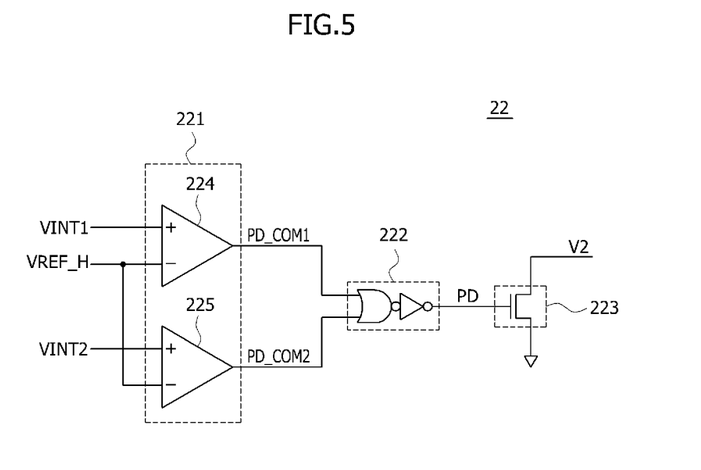
FIG. 5 is a circuit diagram illustrating an example of a pull-down driver included in an internal voltage generation circuit shown in FIG. 3.

FIG. 5 is a circuit diagram illustrating an example of a pull-down driver included in an internal voltage generation circuit shown in FIG. 3.

As illustrated in FIG. 5, the pull-down driver 22 may be configured to include a second comparison signal generator 221, a second signal combining unit 222 and a pull-down unit 223. The second comparison signal generator 221 may include a third comparator 224 and a fourth comparator 225. The third comparator 224 may generate an enabled first pull-down comparison signal PD_COM1, e.g., a first pull-down comparison signal PD_COM1 having a logic "high" state when the first internal voltage signal VINT1 has a higher voltage level than the upper limit reference voltage signal VREF_H, and the fourth comparator 225 may generate an enabled second pull-down comparison signal PD_COM2, e.g., a second pull-down comparison signal PD_COM2 having a logic "high" state when the second internal voltage signal VINT2 has a higher voltage level than the upper limit reference voltage signal VREF_H. The second signal combining unit 222 may generate an enabled pull-down driving signal PD, e.g. a pull-down driving signal PD having a logic "high" state when at least one of the first and second pull-down comparison signals PD_COM1 and PD_COM2 is enabled to have a logic "high" state. The pull-down unit 223 may pull down the second voltage V2 to a ground voltage when the pull-down driving signal PD is enabled to have a logic "high" state.

As described above, according to an embodiment of the present invention, the pull-up driver 21 and the pull-down driver 22 may be commonly used in generation of both the first and second internal voltage signals VINT1 and VINT2.

Referring again to FIGS. 3, 4 and 5, when at least one of the first and second internal voltage signals VINT1 and VINT2 has a lower voltage level than the lower limit reference voltage signal VREF_L, an enabled pull-up driving signal PU, e.g., the pull-up driving signal PU having a logic "low" state may turn on the pull-up unit 213 to pull up the first voltage V1 to a power supply voltage and the first voltage V1 may be transmitted as either the first internal voltage signal VINT1 or the second internal voltage signal VINT2. For example, when the first internal voltage signal VINT1 has a lower voltage level than the lower limit reference voltage signal VREF_L and the second internal voltage signal VINT2 has a higher voltage level than the lower limit reference voltage signal VREF_L, the first voltage V1 may be transmitted as the first internal voltage signal VINT1. Further, for example, when the second internal voltage signal VINT2 has a lower voltage level than the first internal voltage signal VINT1 in a state in which both the first and second internal voltage signals VINT1 and VINT2 have lower voltage levels than the lower limit reference voltage signal VREF_L, the first voltage V1 may be transmitted as the second internal voltage signal VINT2 and may then be transmitted as the first internal voltage signal VINT1.

When at least one of the first and second internal voltage signals VINT1 and VINT2 has a higher voltage level than the upper limit reference voltage signal VREF_H, an enabled pull-down driving signal PD, e.g., the pull-down driving signal PD having a logic "high" state may turn on the pull-down unit 223 to pull down the second voltage V2 to a ground voltage and the second voltage V2 may be transmitted as either the first internal voltage signal VINT1 or the second internal voltage signal VINT2. For example, when the first internal voltage signal VINT1 has a higher voltage level than the upper limit reference voltage signal VREF_H and the second internal voltage signal VINT2 has a lower voltage level than the upper limit reference voltage signal VREF_H, the second voltage V2 may be transmitted as the first internal voltage signal VINT1. Further, for example, when the second internal voltage signal VINT2 has a higher voltage level than the first internal voltage signal VINT1 in a state in which both the first and second internal voltage signals VINT1 and VINT2 have higher voltage levels than the upper limit reference voltage signal VREF_H, the second voltage V2 may be transmitted as the second internal voltage signal VINT2 and may then be transmitted as the first internal voltage signal VINT1.

According to an embodiment of the present invention, the pull-up driver 21 and the pull-down driver 22 may be commonly used in generation of the first internal voltage signal VINT1 having a first internal voltage as well as the second internal voltage signal VINT2 having a second internal voltage. Thus, an area that the internal voltage generation circuit occupies may be reduced.

Figure 6:
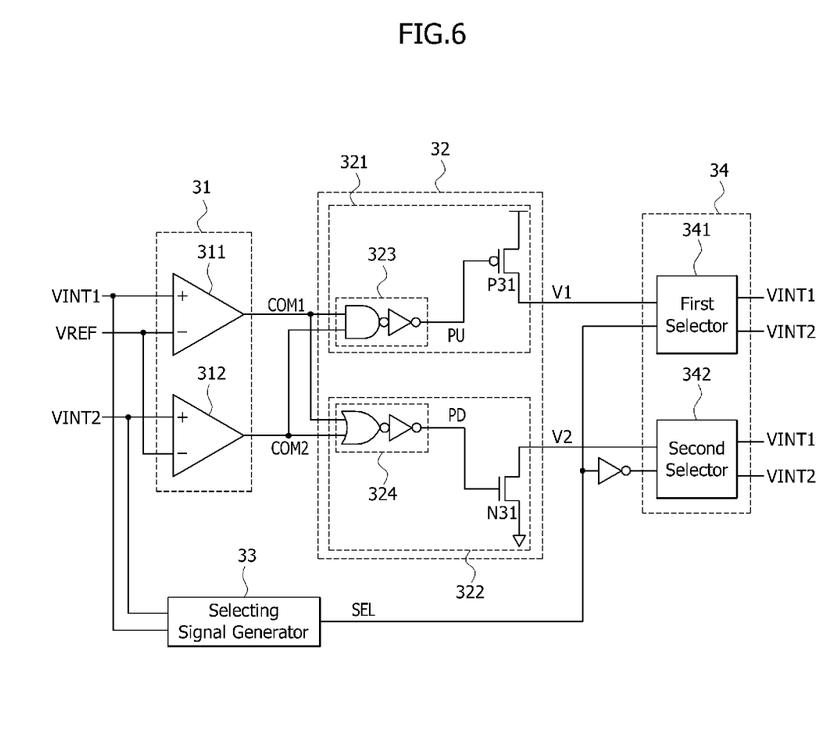
FIG. 6 is a block diagram illustrating a configuration of an internal voltage generation circuit according to yet another example embodiment.

FIG. 6 is a block diagram illustrating a configuration of an internal voltage generation circuit according to an example embodiment of the present invention.

As illustrated in FIG. 6, an internal voltage generation circuit according to an embodiment of the present invention may be configured to include a comparison signal generator 31, a voltage generator 32, a selecting signal generator 33 and a selector (or a selection transmitter) 34. The voltage generator 32 may include a first voltage generator 321 and a second voltage generator 322.

The comparison signal generator 31 may include a first comparator 311 and a second comparator 312. The first comparator 311 may compare a first internal voltage signal VINT1 with a reference voltage signal VREF to generate a first comparison signal COM1. The first comparison signal COM1 may have a logic "low" state when the first internal voltage signal VINT1 has a lower voltage level than the reference voltage signal VREF, and the first comparison signal COM1 may have a logic "high" state when the first internal voltage signal VINT1 has a higher voltage level than the reference voltage signal VREF. The second comparator 312 may compare a second internal voltage signal VINT2 with the reference voltage signal VREF to generate a second comparison signal COM2. The second comparison signal COM2 may have a logic "low" state when the second internal voltage signal VINT2 has a lower voltage level than the reference voltage signal VREF, and the second comparison signal COM2 may have a logic "high" state when the second internal voltage signal VINT2 has a higher voltage level than the reference voltage signal VREF.

The first voltage generator 321 may include a first signal combining unit 323 and a PMOS transistor P31. The first signal combining unit 323 may generate an enabled pull-up driving signal PU, e.g., a pull-up driving signal PU having a logic "low" state when at least one of the first and second comparison signals COM1 and COM2 has a logic "low" state. The pull-up driving signal PU enabled to have a logic "low" state may turn on the PMOS transistor P31 to pull up an output signal (e.g., a first voltage V1) of the PMOS transistor P31 to a power supply voltage. That is, the PMOS transistor P31 may act as a pull-up driving element.

The second voltage generator 322 may include a second signal combining unit 324 and an NMOS transistor N31. The second signal combining unit 324 may generate an enabled pull-down driving signal PD, e.g., a pull-down driving signal PD having a logic "high" state when at least one of the first and second comparison signals COM1 and COM2 has a logic "high" state. The pull-down driving signal PD enabled to have a logic "high" state may turn on the NMOS transistor N31 to pull down an output signal (e.g., a second voltage V2) of the NMOS transistor N31 to a ground voltage. That is, the NMOS transistor N31 may act as a pull-down driving element.

The selecting signal generator 33 may compare the first internal voltage signal VINT1 with the second internal voltage signal VINT2 to generate a selection signal SEL. The selection signal SEL may have a logic "low" state when the first internal voltage signal VINT1 has a lower voltage level than the second internal voltage signal VINT2, and the selection signal SEL may have a logic "high" state when the first internal voltage signal VINT1 has a higher voltage level than the second internal voltage signal VINT2. In some embodiments of the present invention, the selection signal SEL may have a logic "high" state when the first internal voltage signal VINT1 has a lower voltage level than the second internal voltage signal VINT2, and the selection signal SEL may have a logic "low" state when the first internal voltage signal VINT1 has a higher voltage level than the second internal voltage signal VINT2.

The selector 34 may be configured to include a first selector 341 and a second selector 342. The first selector 341 may transmit the first voltage V1 as the first internal voltage signal VINT1 when the selection signal SEL has a logic "low" state and may transmit the first voltage V1 as the second internal voltage signal VINT2 when the selection signal SEL has a logic "high" state. The second selector 342 may transmit the second voltage V2 as the second internal voltage signal VINT2 when the selection signal SEL has a logic "low" state and may transmit the second voltage V2 as the first internal voltage signal VINT1 when the selection signal SEL has a logic "high" state.

As described above, according to an embodiment of the present invention, the voltage generator 32 may be commonly used in generation of both the first and second internal voltage signals VINT1 and VINT2.

Referring again to FIG. 6, when at least one of the first and second internal voltage signals VINT1 and VINT2 has a lower voltage level than the reference voltage signal VREF, the pull-up driving signal PU enabled to have a logic "low" state may turn on the PMOS transistor P31 to pull up the first voltage V1 to a power supply voltage and the first voltage V1 may be transmitted as either the first internal voltage signal VINT1 or the second internal voltage signal VINT2. For example, when the first internal voltage signal VINT1 has a lower voltage level than the reference voltage signal VREF and the second internal voltage signal VINT2 has a higher voltage level than the reference voltage signal VREF, the first voltage V1 may be transmitted as the first internal voltage signal VINT1. Further, for example, when the first and second internal voltage signals VINT1 and VINT2 have lower voltage levels than the reference voltage signal VREF and the second internal voltage signal VINT2 has a lower voltage level than the first internal voltage signal VINT1, the first voltage V1 may be transmitted as the second internal voltage signal VINT2 and may then be transmitted as the first internal voltage signal VINT1.

Alternatively, when at least one of the first and second internal voltage signals VINT1 and VINT2 has a higher voltage level than the reference voltage signal VREF, the pull-down driving signal PD enabled to have a logic "high" state may turn on the NMOS transistor N31 to pull down the second voltage V2 to a ground voltage and the second voltage V2 may be transmitted as either the first internal voltage signal VINT1 or the second internal voltage signal VINT2. For example, when the first internal voltage signal VINT1 has a higher voltage level than the reference voltage signal VREF and the second internal voltage signal VINT2 has a lower voltage level than the reference voltage signal VREF, the second voltage V2 may be transmitted as the first internal voltage signal VINT1. Further, for example, when the first and second internal voltage signals VINT1 and VINT2 have higher voltage levels than the reference voltage signal VREF and the second internal voltage signal VINT2 has a higher voltage level than the first internal voltage signal VINT1, the second voltage V2 may be transmitted as the second internal voltage signal VINT2 and may then be transmitted as the first internal voltage signal VINT1.

According to an embodiment of the present invention, the voltage generator 32 may be commonly used in generation of the first internal voltage signal VINT1 having a first internal voltage as well as the second internal voltage signal VINT2 having a second internal voltage. Thus, an area that the internal voltage generation circuit occupies may be reduced.

The example embodiments of the present invention have been disclosed above for illustrative purposes. Those skilled in the art will appreciate that various modifications, additions and substitutions are possible, without departing from the scope and spirit of the inventive concept as disclosed in the accompanying claims.

What is claimed is:

1. An internal voltage generation circuit comprising:
   a driving signal generator configured to compare first and second internal voltage signals with lower and upper limit reference voltage signals to generate a pull-up driving signal and a pull-down driving signal;
   a driver configured to generate a first voltage and a second voltage in response to the pull-up driving signal and the pull-down driving signal;
   a selecting signal generator configured to compare the first internal voltage signal with the second internal voltage signal to generate a selection signal; and
   a selection transmitter configured to transmit any one of the first and second voltages to the first or second internal voltage signal in response to the selection signal,
   wherein the selection signal has a first level when the first internal voltage signal has a lower voltage level than the second internal voltage signal, and a second level when the first internal voltage signal has a higher voltage level than the second internal voltage signal.

2. The internal voltage generation circuit of claim 1, wherein the driving signal generator generates the pull-up driving signal which is enabled when at least one of the first and second internal voltage signals has a lower voltage level than the lower limit reference voltage signal, and the driving signal generator generates the pull-down driving signal which is enabled when at least one of the first and second internal voltage signals has a higher voltage level than the upper limit reference voltage signal.

3. The internal voltage generation circuit of claim 2, wherein the driving signal generator includes:
   a comparison signal generator configured to compare the first and second internal voltage signals with the lower limit reference voltage signal to generate a first pull-up comparison signal and a second pull-up comparison signal and compare the first and second internal voltage signals with the upper limit reference voltage signal to generate a first pull-down comparison signal and a second pull-down comparison signal; and
   a signal combining unit configured to combine the first pull-up comparison signal with the second pull-up comparison signal to generate the pull-up driving signal and combine the first pull-down comparison signal with the second pull-down comparison signal to generate the pull-down driving signal.

4. The internal voltage generation circuit of claim 3:
   wherein the comparison signal generator generates the first pull-up comparison signal which is enabled when the first internal voltage signal has a lower voltage level than the lower limit reference voltage signal;
   wherein the comparison signal generator generates the second pull-up comparison signal which is enabled when the second internal voltage signal has a lower voltage level than the lower limit reference voltage signal;
   wherein the comparison signal generator generates the first pull-down comparison signal which is enabled when the first internal voltage signal has a higher voltage level than the upper limit reference voltage signal; and
   wherein the comparison signal generator generates the second pull-down comparison signal which is enabled when the second internal voltage signal has a higher voltage level than the upper limit reference voltage signal.

5. The internal voltage generation circuit of claim 3:
   wherein the signal combining unit generates the pull-up driving signal which is enabled when at least one of the first and second pull-up comparison signals is enabled; and
   wherein the signal combining unit generates the pull-down driving signal which is enabled when at least one of the first and second pull-down comparison signals is enabled.

6. The internal voltage generation circuit of claim 1, wherein the driver includes:

a pull-up driving element configured to pull up the first voltage to a power supply voltage when the pull-up driving signal is enabled; and a pull-down driving element configured to pull down the second voltage to a ground voltage when the pull-down driving signal is enabled.

7. The internal voltage generation circuit of claim 1, wherein the selection transmitter includes:

a first selector configured to transmit the first voltage as the first internal voltage signal when the selection signal has the first level and transmit the first voltage as the second internal voltage signal when the selection signal has the second level; and a second selector configured to transmit the second voltage as the second internal voltage signal when the selection signal has the first level and transmit the second voltage as the first internal voltage signal when the selection signal has the second level.

8. An internal voltage generation circuit comprising:

a pull-up driver configured to compare first and second internal voltage signals with a lower limit reference voltage signal to pull up a first voltage;

a pull-down driver configured to compare the first and second internal voltage signals with an upper limit reference voltage signal to pull down a second voltage;

a selecting signal generator configured to compare the first internal voltage signal with the second internal voltage signal to generate a selection signal;

a first selector configured to transmit the first voltage as the first internal voltage signal or the second internal voltage signal in response to the selection signal; and a second selector configured to transmit the second voltage as the first internal voltage signal or the second internal voltage signal in response to the selection signal.

9. The internal voltage generation circuit of claim 8, wherein the pull-up driver pulls up the first voltage when at least one of first and second internal voltage signals has a lower voltage level than the lower limit reference voltage signal.

10. The internal voltage generation circuit of claim 9, wherein the pull-up driver includes:

a first comparison signal generator configured to compare the first and second internal voltage signals with the lower limit reference voltage signal to generate a first pull-up comparison signal and a second pull-up comparison signal;

a first signal combining unit configured to combine the first pull-up comparison signal with the second pull-up comparison signal to generate a pull-up driving signal; and a pull-up unit configured to pull up the first voltage in response to the pull-up driving signal.

11. The internal voltage generation circuit of claim 10:

wherein the first comparison signal generator generates the first pull-up comparison signal which is enabled when the first internal voltage signal has a lower voltage level than the lower limit reference voltage signal; and wherein the first comparison signal generator generates the second pull-up comparison signal which is enabled when the second internal voltage signal has a lower voltage level than the lower limit reference voltage signal.

12. The internal voltage generation circuit of claim 11, wherein the first signal combining unit generates the pull-up driving signal which is enabled when at least one of the first and second pull-up comparison signals is enabled.

13. The internal voltage generation circuit of claim 12, wherein the pull-up unit pulls up the first voltage to a power supply voltage when the pull-up driving signal is enabled.

14. The internal voltage generation circuit of claim 8, wherein the pull-down driver pulls down the second voltage when at least one of first and second internal voltage signals has a higher voltage level than the upper limit reference voltage signal.

15. The internal voltage generation circuit of claim 14, wherein the pull-down driver includes:

a second comparison signal generator configured to compare the first and second internal voltage signals with the upper limit reference voltage signal to generate a first pull-down comparison signal and a second pull-down comparison signal;

a second signal combining unit configured to combine the first pull-down comparison signal with the second pull-down comparison signal to generate a pull-down driving signal; and a pull-down unit configured to pull down the second voltage in response to the pull-down driving signal.

16. The internal voltage generation circuit of claim 15:

wherein the second comparison signal generator generates the first pull-down comparison signal which is enabled when the first internal voltage signal has a higher voltage level than the upper limit reference voltage signal; and wherein the second comparison signal generator generates the second pull-down comparison signal which is enabled when the second internal voltage signal has a higher voltage level than the upper limit reference voltage signal.

17. The internal voltage generation circuit of claim 16, wherein the second signal combining unit generates the pull-down driving signal which is enabled when at least one of the first and second pull-down comparison signals is enabled.

18. The internal voltage generation circuit of claim 15, wherein the pull-down unit pulls down the second voltage to a ground voltage when the pull-down driving signal is enabled.

19. The internal voltage generation circuit of claim 8:

wherein the selection signal generated by the selecting signal generator has a first level when the first internal voltage signal has a lower voltage level than the second internal voltage signal; and wherein the selection signal generated by the selecting signal generator has a second level when the first internal voltage signal has a higher voltage level than the second internal voltage signal.

20. The internal voltage generation circuit of claim 19:

wherein the first selector transmits the first voltage as the first internal voltage signal when the selection signal has a first level; and wherein the first selector transmits the first voltage as the second internal voltage signal when the selection signal has a second level.

21. The internal voltage generation circuit of claim 19:

wherein the second selector transmits the second voltage as the second internal voltage signal when the selection signal has a first level; and wherein the second selector transmits the second voltage as the first internal voltage signal when the selection signal has a second level.

22. An internal voltage generation circuit comprising:

a comparison signal generator configured to compare first and second internal voltage signals with a reference voltage signal to generate a first comparison signal and a second comparison signal;

a voltage generator configured to generate a first voltage and a second voltage in response to the first and second comparison signals;

a selecting signal generator configured to compare the first internal voltage signal with the second internal voltage signal to generate a selection signal; and a selection transmitter configured to transmit any one of the first and second voltages to the first or second internal voltage signal in response to the selection signal, wherein the selection signal has a first level when the first internal voltage signal has a lower voltage level than the second internal voltage signal, and a second level when the first internal voltage signal has a higher voltage level than the second internal voltage signal.

23. The internal voltage generation circuit of claim 22:

wherein the first comparison signal has a third level when the first internal voltage signal has a lower voltage level than the reference voltage signal; and wherein the first comparison signal has a fourth level when the first internal voltage signal has a higher voltage level than the reference voltage signal.

24. The internal voltage generation circuit of claim 23:

wherein the second comparison signal has the third level when the second internal voltage signal has a lower voltage level than the reference voltage signal; and wherein the second comparison signal has the fourth level when the second internal voltage signal has a higher voltage level than the reference voltage signal.

25. The internal voltage generation circuit of claim 24, wherein the voltage generator includes:

a first voltage generator configured to generate the first voltage which is pulled up when at least one of the first and second comparison signals has the third level; and a second voltage generator configured to generate the second voltage which is pulled down when at least one of the first and second comparison signals has the fourth level.

26. The internal voltage generation circuit of claim 25, wherein the first voltage generator includes:

a first signal combining unit configured to generate a pull-up driving signal which is enabled when at least one of the first and second comparison signals has the third level; and a pull-up driving element configured to pull up the first voltage to a power supply voltage in response to the pull-up driving signal.

27. The internal voltage generation circuit of claim 25, wherein the second voltage generator includes:

a second signal combining unit configured to generate a pull-down driving signal which is enabled when at least one of the first and second comparison signals has the fourth level; and a pull-down driving element configured to pull down the second voltage to a ground voltage in response to the pull-down driving signal.

28. The internal voltage generation circuit of claim 22, wherein the selection transmitter includes:

a first selector configured to transmit the first voltage as the first internal voltage signal when the selection signal has the first level and transmit the first voltage as the second internal voltage signal when the selection signal has the second level; and a second selector configured to transmit the second voltage as the second internal voltage signal when the selection signal has the first level and transmit the second voltage as the first internal voltage signal when the selection signal has the second level.

* * * * *